United States Patent [19]

Truong et al.

[11] Patent Number: 5,392,248

[45] Date of Patent: Feb. 21, 1995

[54] CIRCUIT AND METHOD FOR DETECTING COLUMN-LINE SHORTS IN INTEGRATED-CIRCUIT MEMORIES

[75] Inventors: Phat C. Truong, Houston; Tim M. Coffman, Sugar Land; Sung-Wei Lin, Houston, all of Tex.; T. Damodar Reddy, Nalgonda, India; Dennis R. Robinson, Needville, Tex.

[73] Assignee: Texas Instruments Incorporated, Dallas, Tex.

[21] Appl. No.: 149,242

[22] Filed: Oct. 26, 1993

[51] Int. Cl.⁶ .................................................. G11C 7/00
[52] U.S. Cl. ..................................... 365/201; 371/21.1
[58] Field of Search .................. 365/201, 63, 72, 205, 365/207, 208; 371/21.1, 21.4

[56] References Cited

U.S. PATENT DOCUMENTS

| | | | |
|---|---|---|---|
| 4,477,884 | 10/1984 | Iwahashi | 365/201 |
| 4,597,062 | 6/1986 | Asano | 365/201 |
| 4,720,818 | 1/1988 | Takeguchi | 365/201 |

*Primary Examiner*—Eugene R. LaRoche
*Assistant Examiner*—Son Mai
*Attorney, Agent, or Firm*—Theodore D. Lindgren; Leo N. Heiting; Richard L. Donaldson

[57] ABSTRACT

The column-line short detection circuit of this invention includes a special test circuit that turns off wordlines (15), a N-channel transistor (23) for each column line (18), a decoder (19a) that uses only the least significant column address (20d) for input to the test circuit, and a sensor (SA) to detect current between shorted column lines (18). Because the column-line short detection circuit of this invention uses only the least significant address as input for column decoder (19a), it requires a very small number of transistors.

8 Claims, 2 Drawing Sheets

CIRCUIT AND METHOD FOR DETECTING COLUMN-LINE SHORTS IN INTEGRATED-CIRCUIT MEMORIES

BACKGROUND OF THE INVENTION

The present invention relates to integrated-circuits and, in particular, to a circuit and method for detecting shorts between adjacent parallel conductors in integrated circuit memories.

In memory arrays where the column lines are parallel to each other and separated by an insulator, one defect arising during manufacture is a short between adjacent column lines. A column-line short may be caused, for example, by an etching process that leaves a filament of conducting material between column lines formed from a single layer of that conducting material, such as doped polycrystalline silicon. It is necessary to test such memory arrays during manufacture to detect the presence or absence of these column-line shorts.

A typical prior-art column-line short detection circuit and method requires a first decoder to couple a selected column line to the sense amplifier and a second decoder to couple the rest of column lines to ground (Vss). All of the wordlines are coupled to low voltage (Vss) during the test. If the sense amplifier indicates no current flow in selected column line, then the selected column line is not shorted to an adjacent column line. However, if the sense amplifier indicates a current flow from the selected column line to an adjacent column line and to ground, then a short exists between the selected column line and an adjacent column line.

The second decoder is complex, requiring a large number of transistors and a large area for layout.

There is a need for a simple circuit and method for detecting shorts between adjacent, parallel conductors in integrated circuit memories.

SUMMARY OF THE INVENTION

The short detection circuit and method of this invention includes a special test circuit that, for example, turns off all wordlines, includes a N-channel transistor for each column line, includes a decoder that uses only the least significant column address for input, and a sensor to detect current between shorted conductors.

An advantage of the short detection circuit and method of this invention is the requirement for a very small number of transistors. The reason is that the short detection circuit of this invention uses only the least significant address as the input for column decoder.

The circuit and method of this invention may be used, for example, to detect drain-column-line shorts in Flash EPROM memories.

DETAILED DESCRIPTION OF THE INVENTION

While the circuit and method of this invention are applicable to any electronic system/circuit with memory elements connected to parallel, adjacent column-line conductors, drain-column lines or bitlines of an EEPROM array are used by way of example to describe use of the invention.

Figure 1:
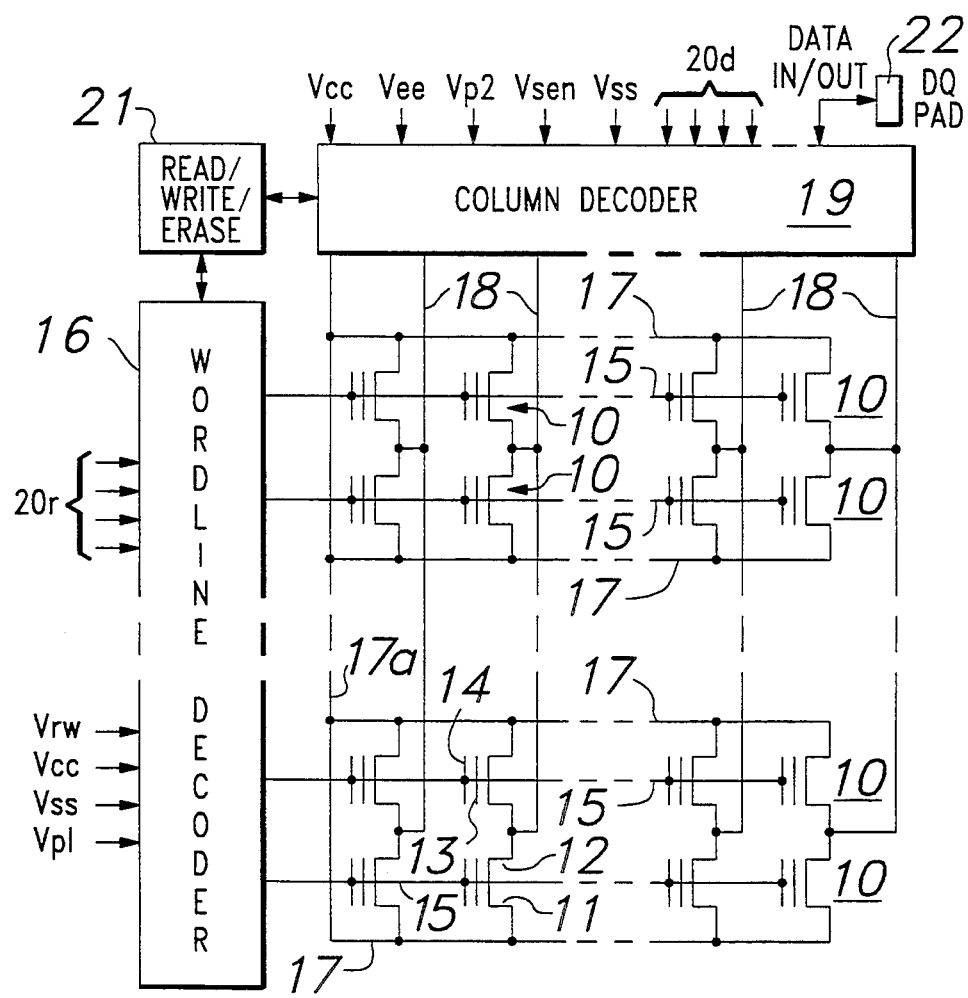
FIG. 1 is an electrical schematic diagram, in partial block form, of an example flash EPROM memory array in which the circuitry and method of this invention may be used.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19. Drain-column lines 18 are typically formed after wordlines 15, source lines 17 and 17a and drains 12 by etching contact holes to the drain 12 diffusions, then depositing a layer of doped polysilicon, then etching the layer of polysilicon to form adjacent parallel drain-column lines 18 connecting drains 12.

In the read mode, the wordline decoder 16 functions, in response to wordline address signals on lines 20r and to signals from Read/Write/Erase control circuit 21 (which may include circuitry of an external microprocessor, not shown), to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

In a write, or program, mode the wordline decoder 16 may function, in response to wordline address signals on lines 20r and to signals from Read/Write/Erase control circuit 21, to place a preselected first programming voltage Vp1 (approx. +12 V) on a selected wordline 15, including a selected control-gate 14. Column decoder 19 also functions to place a second programming voltage Vp2 (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with Vp1 at 0 V). For memory cells 10 fabricated in accordance with the example embodiment, the coupling coefficient between a control gate 14/wordline 15 and a floating gate 13 is approximately 0.6. Therefore, a prior-art programming voltage Vp1 of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash-erase mode, the column decoder 19 functions to leave all drain-column lines 18 floating (connected to a high impedance such as field-effect transistor biased in "OFF" condition). The wordline decoder 16 functions to connect all the wordlines 15 to reference potential Vss, which may be ground. The column decoder 19 also functions to apply a high positive voltage Vee (approx. +9 V to +15 V) to all the source lines 17. These erasing voltages create sufficient field strength across the gate oxide region to generate a Fowler-Nordheim tunnel current that transfers charge from the floating gate 13, erasing the memory cell 10.

For convenience, a table of read, write and erase voltages, is given in TABLE I below:

TABLE I

|  | Read | Write | Flash Erase |
| --- | --- | --- | --- |
| Selected Wordline | 5V | 12V | 0V (All) |
| Deselected Wordlines | 0V | 0V | — |
| Selected Drain Line | 1.0V | 5–10V | Float (All) |
| Deselected Drain Lines | 0V/Float | 0V/Float | — |
| Source Lines | 0V | 0V | 9–15V (All) |

Figure 2:
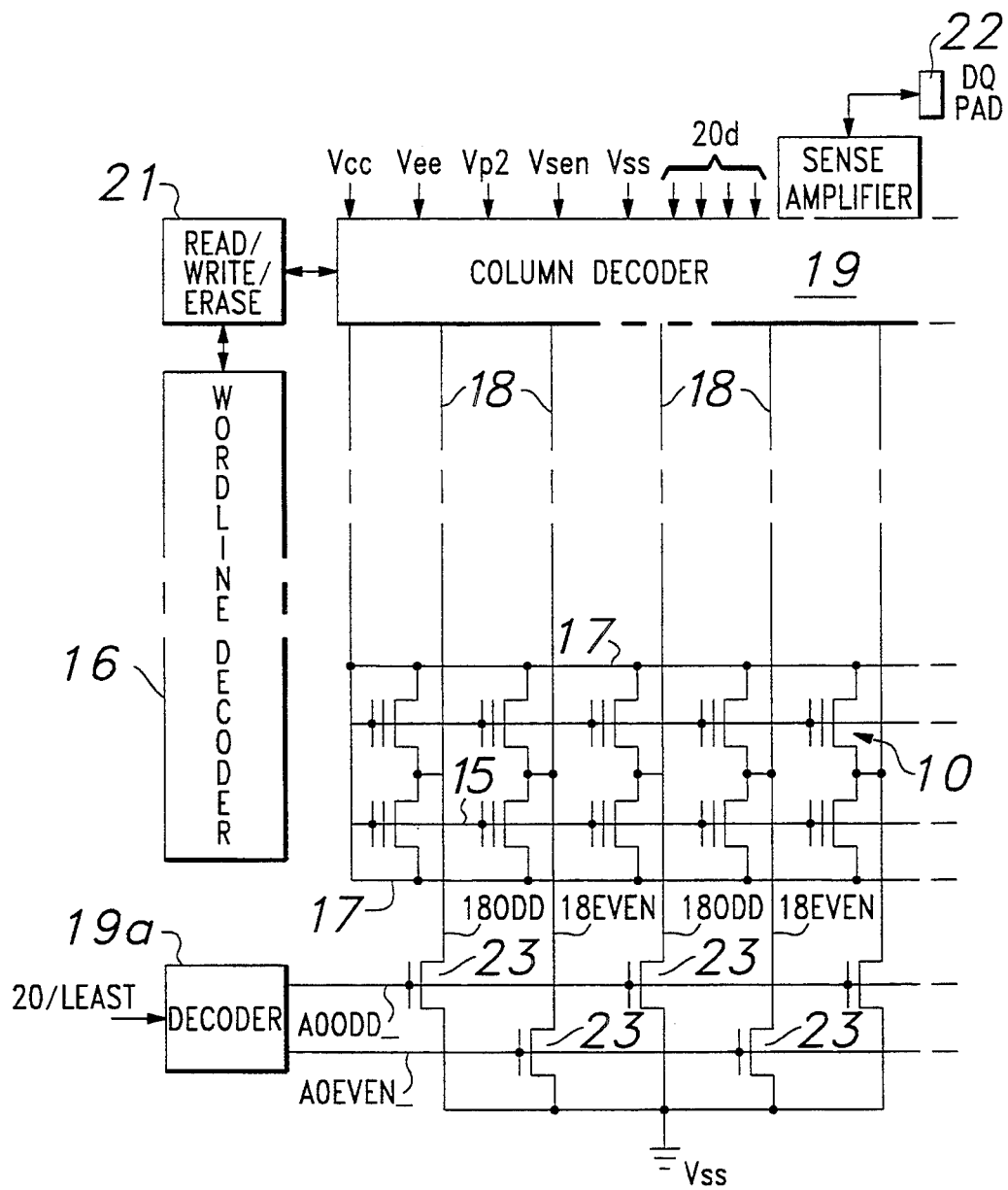
FIG. 2 is a schematic diagram of the column-line short detection circuitry of this invention.

The circuit of FIG. 2, which may be physically located in decoders 16 and 19 and in control circuit 21, takes advantage of the facts that alternating drain-column lines 18ODD are only shorted to the other alternating drain-column lines 18EVEN and that every drain-column line 18 is connected to ground through a N-channel transistor 23. In many devices, existing N-channel transistors 23 are used to discharge the capacitance of drain-column lines 18 to ground. As used in the circuit of this invention, the gates of the N-channel transistors 23 of the alternating drain-column lines 18EVEN are connected to common terminal A0EVEN_ and the gates of the N-channel transistors 23 of the other alternating drain-column lines 18ODD are connected to common terminal A0ODD_. The voltage level of common terminal A0EVEN_ is high (Vcc, or the supply voltage, furnished by decoder 19a in response to the least significant column address 20/LEAST) if the odd drain-column lines 18 are selected and the voltage level of common terminal A0ODD_ is high (Vcc) if the even drain-column lines 18 are selected. The voltage applied to all of the wordlines 15 by wordline decoder 16 is low (Vss, or ground) when using the circuit of FIG. 2. If the alternating drain-column lines 18EVEN are selected to read through sense amplifier, all of the other alternating bit lines 18ODD are pulled to ground through the odd N-channel transistors 23. If at least one short exists between odd and even drain-column lines 18EVEN and 18ODD, the sense amplifier SA detects current in the even drain-column lines 18EVEN. If no short exists, the sense amplifier SA detects no-current in the even drain-column lines 18EVEN. A similar description applies to the case where the odd drain-column lines 18ODD are selected. Decoder 19 can be used to check one drain-column line at a time, or all of the drain-column lines may be checked simultaneously using the digital output of decoder 19a in response to the least significant bit of the column address inputs 20/LEAST.

Because drain-column-line shorts occur only between odd and even drain-column lines 18ODD and 18EVEN, only one least significant address is required to decode between odd and even drain-column lines 18. This reduces significantly the number of transistors needed to detect the presence of a drain-column-line short.

The method described herein for detecting shorts between parallel column lines of a memory array comprises (1) coupling a reference-potential electrode to each of the wordlines, (2) coupling at least one of alternating column lines to a sensing circuit, coupling the other alternating column lines to the reference-potential electrode; and (3) sensing the resistance to current flow between the alternating column line and the other alternating column lines.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for detecting shorts between parallel column lines of a memory array, said parallel column lines including alternate column lines and other alternate column lines, said memory array including wordlines, column address inputs and a reference-potential, said method comprising:
   connecting said reference-potential to each of said wordlines;
   coupling said alternate column lines to a sensing circuit, coupling said other alternate column lines to said reference-potential; and
   with said wordlines at said reference potential and with said alternate column lines and said other alternate column lines coupled to said sensing circuit and to said reference-potential, sensing the resistance to current flow between said alternate column lines and said other alternate column lines.

2. The method of claim 1, wherein said column lines are doped polycrystalline silicon conductors.

3. The method of claim 1, wherein said other alternate column lines are coupled to said reference-potential by N-channel transistors.

4. The method of claim 1, wherein said sensing circuit is a sense amplifier.

5. The method of claim 1, wherein said memory array includes rows and columns of floating-gate memory cells.

6. The method of claim 1, wherein the source-drain path of a transistor couples each said column line to said reference-potential, wherein the gates of those said transistors coupled to said alternate column lines are coupled to a first control electrode, wherein the gates of those said transistors coupled to said other alternate column lines are coupled to a second control electrode.

7. The method of claim 6, wherein a decoder, in response to a column-address input, couples said first control electrode to said reference-potential and couples said second control electrode to a second voltage different from the voltage at said reference-potential.

8. The method of claim 1, wherein said wordlines are connected to said reference potential by a wordline decoder.

* * * * *